United States Patent [19]

Iwamatsu

[11] Patent Number: 5,294,821
[45] Date of Patent: Mar. 15, 1994

[54] THIN-FILM SOI SEMICONDUCTOR DEVICE HAVING HEAVILY DOPED DIFFUSION REGIONS BENEATH THE CHANNELS OF TRANSISTORS

[75] Inventor: Seiichi Iwamatsu, Suwa, Japan

[73] Assignee: Seiko Epson Corporation, Tokyo, Japan

[21] Appl. No.: 773,162

[22] Filed: Oct. 8, 1991

[30] Foreign Application Priority Data

| Oct. 9, 1990 | [JP] | Japan | 2-271262 |
| Oct. 9, 1990 | [JP] | Japan | 2-271263 |
| Oct. 9, 1990 | [JP] | Japan | 2-271264 |
| Nov. 26, 1990 | [JP] | Japan | 2-321805 |
| Nov. 28, 1990 | [JP] | Japan | 2-328090 |

[51] Int. Cl.$^5$ .................... H01L 27/01; H01L 27/12; H01L 29/76
[52] U.S. Cl. .................... 257/351; 257/347; 257/350; 257/352; 257/369
[58] Field of Search ............ 357/23.1, 23.7, 42, 357/71; 257/347, 350, 351, 352, 360, 774

[56] References Cited

U.S. PATENT DOCUMENTS

| 4,716,128 | 12/1987 | Schubert et al. | 437/41 |
| 4,763,183 | 8/1988 | Ng et al. | 357/23.7 |
| 4,884,116 | 11/1989 | Shirai | 357/41 |
| 4,902,637 | 2/1990 | Kondou et al. | 357/23.7 |
| 4,907,047 | 3/1990 | Kato et al. | 357/23.7 |
| 4,965,872 | 10/1990 | Vasudev | 257/350 |
| 4,966,864 | 10/1990 | Pfiester | 437/191 |
| 4,974,041 | 11/1990 | Grinberg | 357/23.7 |
| 4,996,575 | 2/1991 | Ipri et al. | 357/42 |
| 5,021,843 | 6/1991 | Ohmi | 357/42 |
| 5,103,277 | 4/1992 | Caviglia et al. | 357/42 |
| 5,191,397 | 3/1993 | Yoshida | 257/347 |

FOREIGN PATENT DOCUMENTS

| 0217406 | 4/1987 | European Pat. Off. | 257/66 |
| 0382165 | 8/1990 | European Pat. Off. | 257/347 |
| 55-43872 | 3/1980 | Japan | 357/23.7 |
| 58-191450 | 11/1983 | Japan | 357/71 |
| 60-167375 | 8/1985 | Japan | 257/365 |
| 206174 | 10/1985 | Japan | 257/59 |
| 60-245173 | 12/1985 | Japan | 357/23.7 |
| 61-134075 | 6/1986 | Japan | 257/66 |
| 61-232676 | 10/1986 | Japan | 357/23.7 |
| 63-29975 | 2/1988 | Japan | 357/23.1 |
| 63-67779 | 3/1988 | Japan | 357/23.1 |
| 2-20475 | 9/1990 | Japan | 257/347 |
| WO86/01037 | 2/1986 | PCT Int'l Appl. | 257/347 |
| WO90/06595 | 6/1990 | PCT Int'l Appl. | 257/347 |

OTHER PUBLICATIONS

*Japanese Journal of Applied Physics*, vol. 29, No. 4, part 2, Apr. 1990, Tokyo, Japan; K. Ishii et al.: "Experimental Fabrication of XMOS Transistors Using Lateral Solid–Phase Epitaxy of CVD Silicon Films".

*Applied Physics Letters*, vol. 55, No. 24, Dec. 11th, 1989, pp. 2544–2546, New York, U.S.; D. Pribat, et al.: "Conformal Vapor Phase Epitaxy".

*IBM Technical Disclosure Bulletin*, vol. 24, No. 11A, Apr. 1982, pp. 5563–5566, New York, U.S.; C. G. Jambotkar: "Enhancing the Performance of Bipolar Transistors".

*IBM Technical Disclosure Bulletin*, vol. 24, No. 7A, Dec. 1981, pp. 3454–3457, New York, U.S.; F. H. De La Moneda: "Self-Aligned Silicide Buried Contacts".

*Primary Examiner*—Rolf Hille
*Assistant Examiner*—Steven Loke
*Attorney, Agent, or Firm*—Harold T. Tsiang

[57] ABSTRACT

Thin-film SOI semiconductor devices formed in a thin film Si semiconductor substrate layer formed on an insulating layer on a semiconductor substrate have improved electrical characteristics and reliable reproducibility of those characteristics in the mass production, which are obtained by utilizing semiconductor substrate having high concentrations of active impurities, or by utilizing voltage biased, impurity diffusion regions in the surface of the semiconductor substrate aligned beneath CMOS FETs formed in the thin film Si layer. They can also be obtained by extension of the semiconductor substrate through the insulating film to the channel region of the CMOS FETs formed in a thin film Si regions. Further, reliably reproducible contact connection of electrodes to buried thin film Si layers is also achieved.

6 Claims, 3 Drawing Sheets

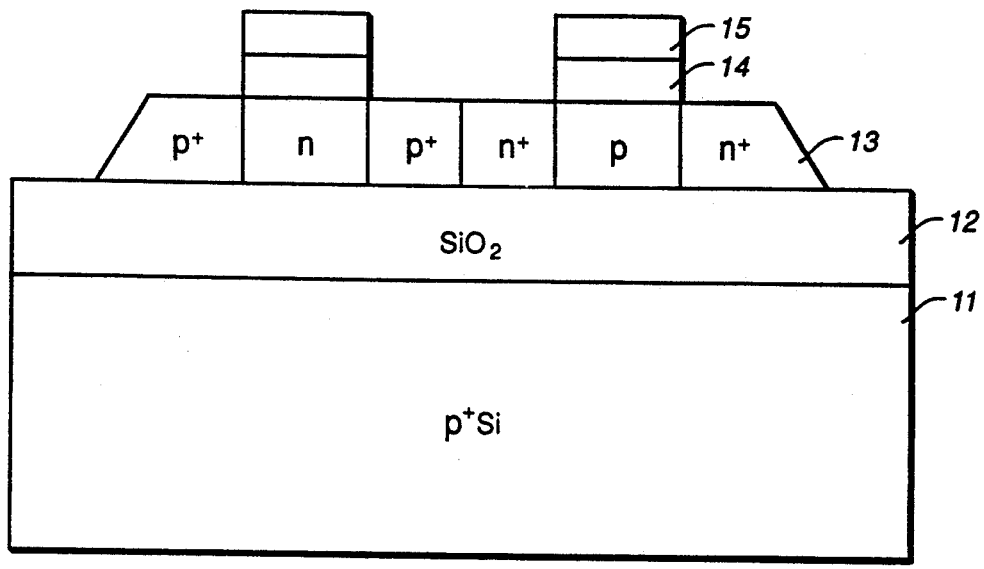
FIG._1
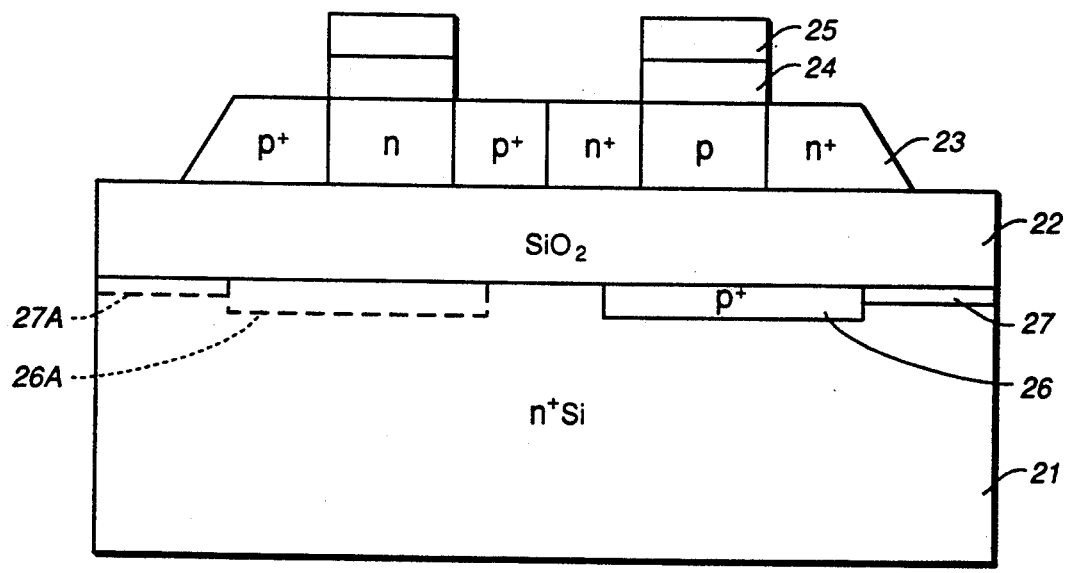
FIG._2

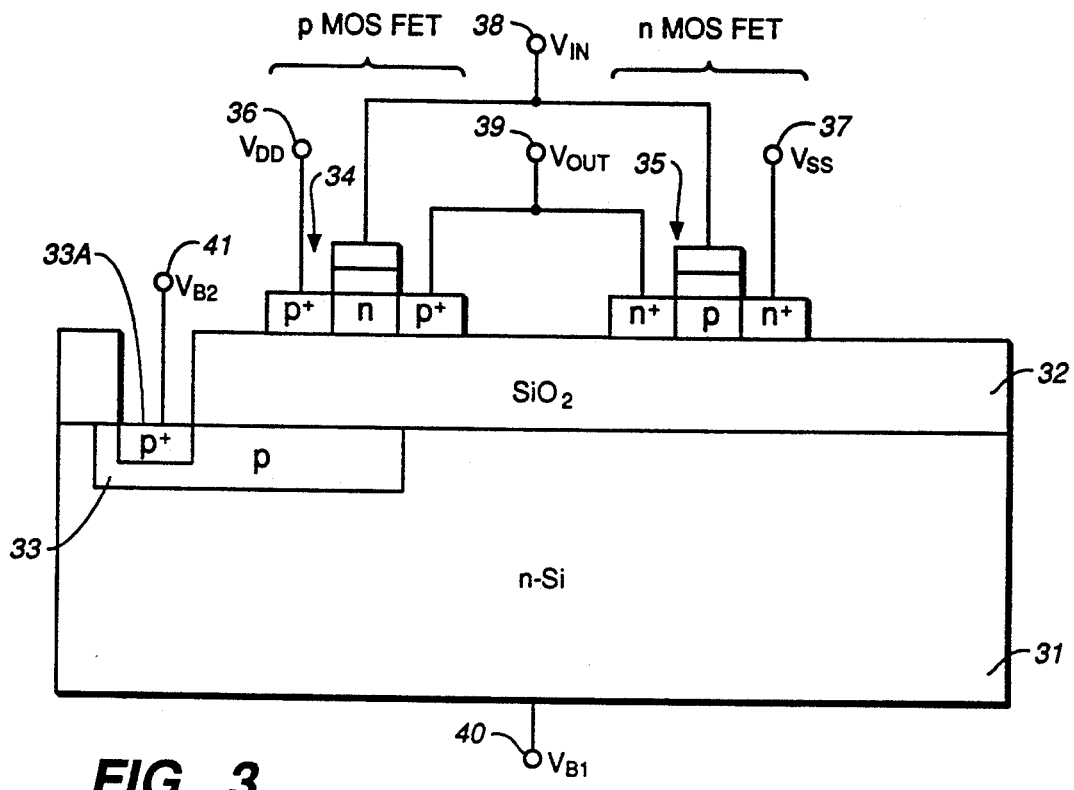
FIG._3
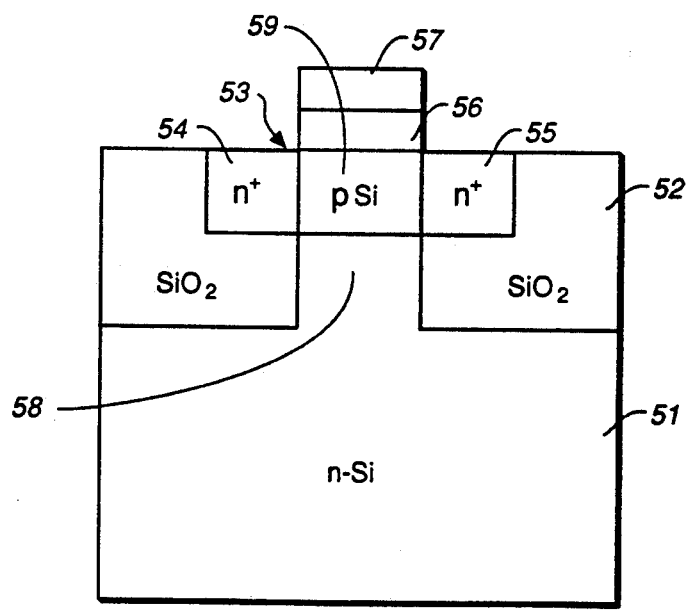
FIG._4

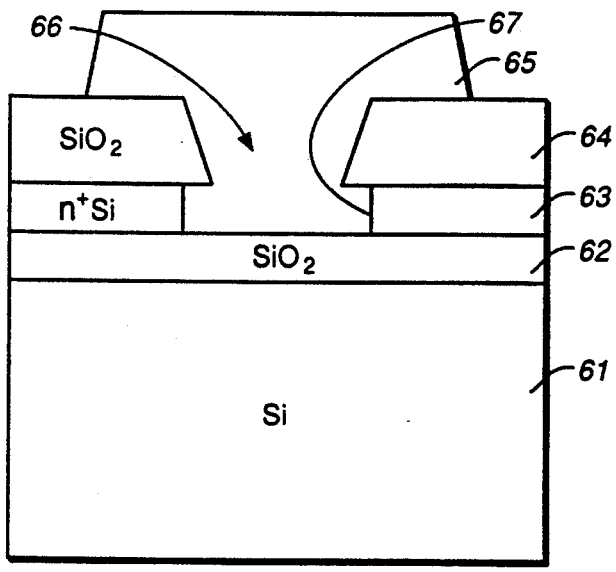
FIG._5
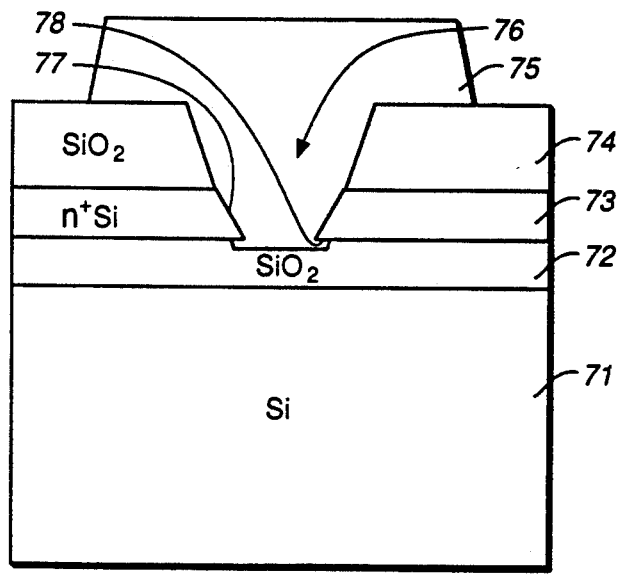
FIG._6
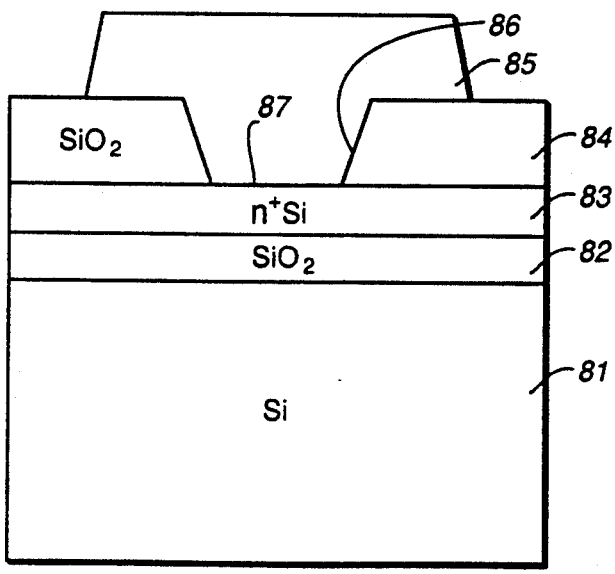
FIG._7
*(PRIOR ART)*

THIN-FILM SOI SEMICONDUCTOR DEVICE HAVING HEAVILY DOPED DIFFUSION REGIONS BENEATH THE CHANNELS OF TRANSISTORS

BACKGROUND OF THE INVENTION

This invention generally pertains to silicon-on-insulator (SOI) technology comprising thin-film semiconductor SOI devices formed on an insulating layer formed on a semiconductor substrate and more particularly to SOI CMOS devices.

SOI devices, such as CMOS FET devices, are formed on prepared insulating layers, such as SIMOX buried oxide layers prepared on semiconductor substrates. Then, an epitaxially deposited Si layer is formed on the oxide layer and CMOS thin-film transistors, e.g., n-channel MOS FET, p-channel MOS FET, are formed in the Si layer with polysilicon gates separated by a thin gate oxide self-aligned relative to the CMOS thin-film transistor channel. In other cases, the thin-film MOS FET are commonly formed relative to a substrate floating condition on a semiconductor film formed on an insulating film.

However, many problems still remain in SOI technology. As an example, the resultant physical and electrical properties of the thin-film semiconductor devices formed in the thin-film layer supported on the prepared insulating layer are not consistently uniform. This because of defects in and ion transfer to the thin-film semiconductor film resulting in film damage thereby affecting its electrical properties and reduce the performance of electrical components, e.g., n-channel MOS FETs, p-channel MOS FETs, formed in the thin films. As an example, the MOS FET threshold voltage of SOI thin-film devices formed in such thin-film semiconductor films will not consistently uniform.

Thus, it is a purpose of this invention to solve this problem by offering a thin-film SOI semiconductor device structure that will consistently yield more uniform electrical characteristics.

Further, in the case of the substrate floating effect of SOI MOS FET thin film semiconductor substrates or base layers formed over SIMOX films, particularly in the case of such devices submicron channel lengths, there is a corresponding decrease in breakdown voltage between the source and drain of such devices. This is referred to as short channeling wherein shortened channel length decreases threshold voltage. Thus, it is a further purpose of the present invention to offer an improved thin-film SOI MOS FET device that will not reduce the breakdown voltage between the source and drain at submicron channel lengths due to the substrate floating effect in SOI MOS FET thin film semiconductor substrates.

An ideal contact portion for a typical thin-film SOI semiconductor device is shown in cross section in FIG. 7. The contact structure comprises a Si semiconductor substrate 81, e.g., 500 $\mu$m thick, upon which is formed, such as, by SIMOX, $SiO_2$ film 82 which may have a thickness of about 0.5 $\mu$m. Next, a n-Si film 83 is epitaxially deposited on $SiO_2$ film 82 which may have a thickness in the range of about 30 nm to 50 nm which is usually employed for such TFTs. This is followed by the CVD deposition of $SiO_2$ film 84 having a thickness in the range of about 0.5 $\mu$m. Then contact hole 86 is formed in $SiO_2$ film 84 by means of conventional wet etching. Lastly, metal or polysilicon electrode 85 is deposited over and in contact hole 86. However, when diameter of contact hole 86 is less than 2 $\mu$m, then dry etching must be employed to obtain this resolution. However, when dry etching is employed, the etching process advances into the thin Si film 83 so that Si film 83 at the bottom of contact hole 86 was depleted or removed so that electrode connection was poor or nonexistent. In other words, it is difficult to control the etching through $SiO_2$ film 84 without also etching away film 83 because end point detection is difficult to achieve in connection with such thin films when employing such a fast etching method to achieve better resolution at smaller scales. Also, any reliable contact to film 83 is not good when seeking to achieve surface contact 87 as the means for reliable contact. Thus, while the configuration shown in FIG. 7 with a large area contact at 87 to film 83 is ideally desired, it cannot be realized in practice, particularly for dimensions less than 2 $\mu$m.

Thus, it is a further purpose of the present invention to offer an improved contact portion for a thin-film SOI semiconductor device of the type shown in FIG. 7 that will ensure reliable and consistently reproducible connection between the semiconductor thin-film and electrode in thin-film SOI semiconductor devices.

SUMMARY OF THE INVENTION

According to this invention, a thin-film SOI semiconductor devices comprising this invention have improved electrical characteristics and reliable reproducibility of those characteristics in the mass production of such devices. In one aspect of this invention, to improve the voltage threshold of formed n-channel or p-channel MOS FET devices, the substrate is doped with a high-concentration active impurity, i.e., $p^+$-type or an $n^+$-type impurity, or an active impurity-diffusion region, i.e., a $p^+$-type or $n^+$-type active impurity-diffusion region, is incorporated into the surface of semiconductor substrate and connected to an appropriate voltage bias. Alternatively, a p-type or n-type region may be formed underlying or beneath a p-channel or n-channel MOS FET in an n-type or p-type semiconductor substrate, respectively.

In another aspect of this invention, a thin-film semiconductor substrate formed on or in an insulating layer delineated with thin-film MOS FETs is connected directly to the semiconductor substrate through a portion of the insulating film.

In a further aspect of this invention, a contact portion relative to a thin-film SOI semiconductor device is provided with improved and accurately reproducible means of electrical connection between a thin-film Si layer formed on an SIMOX insulating film through an etched contact hole and an electrode subsequently deposited over and into the contact hole. An increase in possible area contact between the Si film and a deposited electrode is provided by means of the exposed sidewall face of the Si film brought about etching, preferably dry etching, in forming the contact hole. The contacting face of the Si film may be the etched and exposed side surface of the Si film or may be the side surface and the undercut surface of the Si film forming a Si film protrusion into the contact hole. The deposited electrode into the contact hole will be in direct contact with the Si film sidewall face and self-aligned relative to the formed Si film protrusion.

The structures of this invention provide for stabilization and repeatability of electrical characteristics, e.g., threshold voltage, of thin-film SOI semiconductor devices. Furthermore, punchthrough (failure in carrier mobility at low voltages due to the substrate floating effect of the thin film substrate) can be prevented in thin-film SOI MOS FETs by impressing a substrate voltage, and, further, the threshold voltage of formed MOS FETs can be determined and controlled. Also, decreased breakdown voltage due to hole injection from the FET drain caused by short channeling of the thin-film MOS FET can be avoided by the expulsion of holes to the semiconductor substrate. Further, a semiconductor thin-film SOI substrate structure supporting SOI semiconductor devices can be reliably connected to a semiconductor substrate. Lastly, a reliable contact portion for connection to thin-film SOI semiconductor devices can be reliably mass produced with assured reliance of sustained electrical connection.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a cross sectional illustration of a first embodiment of this invention illustrating a thin-film SOI semiconductor device.

FIG. 2 is a cross sectional illustration of a second embodiment of this invention illustrating a thin-film SOI semiconductor device.

FIG. 3 is a cross sectional illustration of a third embodiment of this invention illustrating a thin-film CMOS FET inverter circuit.

FIG. 4 is a cross sectional illustration of a fourth embodiment of this invention illustrating a thin-film MOS FET.

FIG. 5 is a cross sectional illustration of first embodiment of this invention illustrating a contact portion of a thin-film SOI semiconductor device.

FIG. 6 is a cross sectional illustration of second embodiment of this invention illustrating a contact portion of a thin-film SOI semiconductor device.

FIG. 7 is a cross sectional illustration of a contact portion of a thin-film semiconductor device as known in the prior art.

DESCRIPTION OF THE PREFERRED EMBODIMENTS

Reference is now made to FIG. 1 illustrating a first embodiment of this invention in the form of a thin-film CMOS FET device. The CMOS FET comprises p+ Si substrate 11 upon which is formed $SiO_2$ film 12 employing SIMOX processing. The thickness of the film 12 is generally within the range of 0.3 μm to 1 μm for good decrease in electrical capacitance. Thin film semiconductor substrate 13 of Si is then formed on the top surface of insulating film 12. Then, photomasking or other such delineation techniques are employed to define active areas in Si film 13 including selective removal of some areas of this film from the surface of the wafer. Next, exposed areas of film 13 are subjected to the diffusion of dopants so that p-type and n-type regions for the MOS FETs are created in film 13. The concentration of the diffusants in these regions may be adjusted by subsequent ion implantation. Then, gate oxide ($SiO_2$) film 14 and gate electrodes 15 are formed on an Si thin film 13 and delineated n-channel and p-channel MOS FETs are formed as known in the art of semiconductor device fabrication and processing. In this embodiment, the threshold voltage of the n-channel MOS FET can be maintained consistently high by minimizing the work function difference between the p-type Si of Si thin film 13 and the high-concentration active impurity provided in Si substrate 11, e.g., p+-Si, by means of providing high electron mobility. The use of high impurity concentration in substrate 11 means an exchange in electrical capacitance by the formation of a depletion layer at the surface of semiconductor substrate 11 at the film 12/substrate 11 interface which also identifies the work function difference and which is directly related to the threshold voltage of the MOS FETs. The active impurity of the Si substrate 11 can be either a p+type or an n+type.

FIG. 2 illustrates a second embodiment of this invention in the form of a thin-film CMOS FET device wherein a p+-type diffusion layer or an n+-type diffusion layer may be formed on the surface of the Si substrate 21 and an electrode 27 is formed from the diffusion layer for connection to a voltage supply. The CMOS FET comprises n+ Si substrate 21 upon which is formed $SiO_2$ film 22 employing, e.g., SIMOX processing. Thin film semiconductor substrate 23 of Si is then formed on insulating film 22. CMOS FETs are then formed in film 23 with gate electrodes 25 separated therefrom by gate oxide ($SiO_2$) film 24. In this embodiment, a p+-type diffusion region 26 is formed on the surface of substrate 21 beneath the n-channel MOS FET. Region 26 is formed on the surface of substrate 21 prior to the deposit of SIMOX film 22 by means of the use of photolithography to mask define the regions followed by ion implantation. Also, a n+-type diffusion regions 26A may formed in substrate 21 beneath p-channel MOS FETs in cases where the substrate is doped p+-Si so that diffusion regions of different conductive types may be beneath such respective FET channels. Furthermore, a n+-type diffusion region may be formed below the n-channel MOS FET and a p+type diffusion region may be formed below the p-channel MOS FET. Thus, in the case of the embodiment shown in FIG. 2, diffusion region 26A could be formed as a p+-type diffusion region. Furthermore, for example, it is feasible to employ p wells in an n+-Si substrate 21 with n+ regions formed in the p wells beneath n-channel or p-channel MOS FETs.

Diffusion regions 26 and 26A are connected to a voltage source via formed interconnects 27 and 27A.

The function of diffusion regions 26 and 26A is to control and stabilize the electrical characteristics of the thin-film SOI semiconductor device, in particular, maintain the threshold voltage of the respective CMOS FETs constant. In other words, low resistivity regions 26, 26A minimize growth of the depletion region into substrate 21 and, as a result, minimizes impact of the SIMOX structure on the MOS FET threshold voltage. These regions make it much easier to accurately determine the work function difference between semiconductor substrate 21 and thin film 23 and, further, determine in an exact manner the capacitance established between semiconductor substrate 21 and thin film 23. Both these parameters directly effect the established threshold voltage of the MOS FETs formed in film 23.

The impurity concentration of substrate diffusion regions relative to FIGS. 1 and 2, i.e., substrates 11 and 21, and diffusion regions 26, are preferably over $1 \times 10^{20}/cm^2$ for both p-type and n-type. The higher the concentration, the better the control over the threshold voltage but, of course, this is limited by the solid solubility of the employed impurity.

The features of this invention can be equally applied in conjunction with bipolar transistors, e.g., through the provision of a p+-type or n+-type active impurity region formed beneath at least the base region of a lateral bipolar TFT and, as a result, stabilization of the current gain $h_{fe}$ can be achieved.

FIG. 3 illustrates a third embodiment of this invention in the form of an inverter circuit employing thin-film CMOS FETs. A p-channel MOS FET 34 and n-channel MOS FET 35 are formed as thin-film SOI semiconductor devices on n-Si substrate 31 with an SIMOX formed SiO$_2$ film 32 therebetween. A p-type diffusion region 33 is formed by ion implantation on the surface of Si substrate 31 beneath p-channel MOS FET 34. A high-concentration diffusion region 33A is formed in P-region 33 for the purpose of establishing good ohmic contact. Region 33A is connected to $V_{B2}$ by line 41 through a contact hole formed in SiO$_2$ film 32. In the case where Si substrate 31 is p-type, diffusion region 33 is formed on the surface of the Si substrate 31 below n-channel MOS FET 35 via an ion implantation of an n-type diffusion. In FIG. 3, supply source voltage, $V_{DD}$, is connected at line 36, reference voltage, $V_{SS}$, is connected at 37, $V_{IN}$ at 38, which is the inverter input voltage and $V_{OUT}$ at 39, which is the output voltage of the inverter circuit.

A reverse voltage is impressed between diffusion region voltage, $V_{B2}$, at 41 and substrate voltage, $V_{B1}$, at 40. By impressing this reverse voltage on substrate 31, any punchthrough due to the substrate floating effect of p-channel MOS FET 34 and n-channel MOS FET 35 is prevented at the p-n junction formed between diffusion region 33 and substrate 31.

FIG. 4 illustrates a fourth embodiment of this invention in the form of a thin-film CMOS FET device. The CMOS FET device comprises insulating (SiO$_2$) film 52 formed on the surface of n-type semiconductor substrate 51 by means of SIMOX. A MOS FET device comprising thin film semiconductor film substrate or region 53 is formed on insulating (SiO$_2$) film 52 comprising source region 54, drain region 55, channel region 59, gate insulating film 56 and gate electrode 57. Semiconductor film substrate 53 is connected to semiconductor substrate 51 via connection region 58 through insulating film 52. In the structure here, the MOS FET junctions are isolated from substrate 51 to minimize capacitance effect while the MOS FET channel is in contact with substrate 51.

Connection region 58 between semiconductor thin-film substrate or region 53 and semiconductor substrate 51 should be formed to be self-aligned, as illustrated in FIG. 4. This is formed by first masking region 58 not to be affected by the SIMOX process. Then, the surface of Si substrate 51 is subjected to SIMOX followed by the formation of thin film region 53. Region 58, however, may be formed to be overlapping with source region 54. Further, semiconductor substrate 51 need not be of the same conductive type as semiconductor film substrate 53 and may be comprised of a polycrystalline or amorphous semiconductor high-resistance film. Also, semiconductor substrate 51 below an n-channel MOS FET may include a p-type region and semiconductor substrate 51 below a p-channel MOS FET may include an n-type region.

The next two embodiments relate to improvements to the contact connection of formed electrodes or wiring to interconnects to buried thin film Si films within which have been formed CMOS MOS FETs. What is needed is reliably repeatable or reproducible means of achieving good electrical contact and physical connection of the deposited electrode to such buried Si films.

FIG. 5 shows an embodiment of this invention illustrating a contact portion of a thin-film SOI semiconductor device. A SIMOX SiO$_2$ film 62 is formed on the surface of Si substrate 61 and thin n+-Si film 63 is formed on SiO$_2$ film 62. Then, SiO$_2$ film 64 is formed on thin Si film 63 by means of CVD. Next, a contact hole 66 having a diameter below 2 μm is formed by dry etching through SiO$_2$ film 64 and n+-Si film 63. Etching is carried out to intentionally remove thin film 63 and under etch this film as shown in FIG. 5. It should be noted that some of the thicker film 62 may be removed but the etchant is slower in this film as it is in film 64. Thus, there is no necessary concern over end point detection employing this dry etch technique. The formation of contact hole 66 is followed by the CVD deposition of a thin Si, W, or TiN film (not shown) for good adhesion and connection to the sidewall 67 of etched Si film 63. This followed by the deposition of an aluminum contact to form electrode 65 so that a good connection is made between electrode 65 and sidewall 67 of Si film 63. As a result, an improved contact area is created by means of dry etching through Si film 63 to expose a sidewall face of the film for good electrical contact to electrode 65.

It should be noted that exposed Si film sidewall 67 need not exist entirely around the circumference of contact hole 66, i.e., it need only be exposed in a portion of contact hole 66 to form the necessary electrical connection with electrode 65.

FIG. 6 shows another embodiment of this invention illustrating a contact portion of a thin-film SOI semiconductor device. A SIMOX SiO$_2$ film 72 is formed on the surface of Si substrate 71 and thin n+-Si film 73 is formed on SiO$_2$ film 72. Then, SiO$_2$ film 74 is formed on thin Si film 73 by means of CVD. Next, a contact hole 76 is formed by dry etching, employing CHF$_3$ gas plasma, through SiO$_2$ film 74 and n+-Si film 73. The etching step is not critical in terms of end point detection and proceeds into the body of SiO$_2$ film 72. This etching process on Si film 73 causes the formation of protruding portion 77 in the sidewall edge of Si film 73 that has a slanted or trapezoidal shape exposing not only a sidewall face of film 73 but also an undercut portion 78 of the film. This etching step is accomplished by either making the selection ratio for dry etching step of the SiO$_2$ and Si films 20:1, or, alternatively, by performing a wet etching step employing a hydrofluoric acid solution after completion of the dry etching step. The protruding portion 77 of sidewall face of film 73 provides for a significant increase in contact area between film 73 and electrode 75. As a result, a reliable electrical contact is formed between n+-Si film 73 and electrode 75, which can be continually assured in mass production of thin-film SOI semiconductor devices.

It should be noted that exposed Si film 73 need not exist entirely around the circumference of contact hole 76 as long as at least a portion thereof is exposed to hole 76. Further, protruding portion 77 need only be formed in one region of contact hole 76 and not around the entire circumference of the hole.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A thin-film SOI semiconductor device, comprising:
   a semiconductor substrate doped with a p+-type active impurity having a high concentration for maintaining the threshold voltage of the device constant;
   an insulating film formed on a surface of said substrate;
   a thin silicon film doped with impurities and forming an n-channel transistor and a p-channel transistor on said insulating film;
   a first n+-type active impurity diffusion region disposed beneath the p-channel transistor in said substrate and coupled to a first bias voltage source, said first diffusion region having a sufficiently high concentration of n-type impurity to maintain the threshold voltage of the p-channel transistor constant; and
   a second n+-type active impurity diffusion region disposed beneath the n-channel transistor in said substrate and coupled to a second bias voltage source, said second diffusion region having a sufficiently high concentration of n-type impurity to maintain the threshold voltage of the n-channel transistor constant.

2. A thin-film SOI semiconductor device, comprising:
   a semiconductor substrate doped with a p+-type active impurity having a high concentration for maintaining the threshold voltage of the device constant;
   an insulating film formed on a surface of said substrate;
   a thin silicon film doped with impurities and forming an n-channel transistor and a p-channel transistor on said insulating film; and
   an n+-type active impurity diffusion region disposed beneath the n-channel transistor in said substrate and coupled to a bias voltage source, said diffusion region having a sufficiently high concentration of n-type impurity to maintain the threshold voltage of the n-channel transistor constant.

3. A thin-film SOI semiconductor device, comprising:
   an n+-type semiconductor substrate having a high concentration of n-type impurity for maintaining the threshold voltage of the device constant;
   an insulating film formed on a surface of said substrate; and
   a thin silicon film doped with impurities and forming an n-channel transistor and a p-channel transistor on said insulating film.

4. The thin-film SOI semiconductor device of claim 3 further comprising a first p+-type active impurity diffusion region disposed beneath the n-channel transistor in said substrate and coupled to a first bias voltage source, said first diffusion region having a sufficiently high concentration of p-type impurity to maintain the threshold voltage of the n-channel transistor constant.

5. The thin-film SOI semiconductor device of claim 4 further comprising a second p+-type active impurity diffusion region disposed beneath the p-channel transistor in said substrate and coupled to a second bias voltage source, said second diffusion region having a sufficiently high concentration of p-type impurity to maintain the threshold voltage of the p-channel transistor constant.

6. The thin-film SOI semiconductor device of claim 3 further comprising a p+-type active impurity diffusion region disposed beneath the p-channel transistor in said substrate and coupled to a bias voltage source, said diffusion region having a sufficiently high concentration of p-type impurity to maintain the threshold voltage of the p-channel transistor constant.

* * * * *